(12) United States Patent
Su et al.

(10) Patent No.: US 10,256,233 B2
(45) Date of Patent: Apr. 9, 2019

(54) DEVICE INCLUDING RESISTOR-CAPACITOR (RC) STRUCTURE AND METHOD OF MAKING THE SAME

(71) Applicant: Taiwan Semiconductor Manufacturing Co., Ltd., Hsin-Chu (TW)

(72) Inventors: Huan-Kuan Su, Hsin-Chu (TW); Yu-Hong Pan, Tainan (TW); Jen-Pan Wang, Tainan (TW); Tong-Min Weng, Hsin-Chu (TW); Tsung-Han Wu, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/883,899

(22) Filed: Jan. 30, 2018

(65) Prior Publication Data

US 2018/0342502 A1 Nov. 29, 2018

Related U.S. Application Data

(60) Provisional application No. 62/511,373, filed on May 26, 2017.

(51) Int. Cl.
*H01L 27/06* (2006.01)
*H01L 49/02* (2006.01)

(52) U.S. Cl.
CPC .......... *H01L 27/0629* (2013.01); *H01L 28/20* (2013.01); *H01L 28/60* (2013.01)

(58) Field of Classification Search
CPC ..... H01L 27/0629; H01L 28/20; H01L 28/60; H01L 28/40; H01L 29/4232; H01L 29/401; H01L 28/75; H01L 27/016; H01L 29/4975; H01L 27/0288; H01L 27/067; H01L 27/0722; H01L 27/0794; H01L 27/101; H01L 2027/11842
See application file for complete search history.

(56) References Cited

U.S. PATENT DOCUMENTS

| 5,717,559 | A | * | 2/1998 | Narita ................. H01L 27/0255 361/111 |
| 6,156,602 | A | * | 12/2000 | Shao .................... H01L 27/0629 257/E21.01 |
| 6,853,024 | B1 | | 2/2005 | Tu |
| 7,903,427 | B2 | | 3/2011 | Itoh et al. |
| 2004/0124477 | A1 | * | 7/2004 | Minami .............. H01L 27/0629 257/379 |
| 2005/0098851 | A1 | * | 5/2005 | Nakayama ...... H01L 21/823814 257/528 |

(Continued)

*Primary Examiner* — Shahed Ahmed
(74) *Attorney, Agent, or Firm* — Duane Morris LLP (57) ABSTRACT

A method for forming a semiconductor device and the resulting device are provided. At least one capacitor in a first gate structure is formed over a substrate. The at least one capacitor includes a first gate electrode including a first conductive layer, a semiconductor layer including a semiconductor material and a dopant, a dielectric layer disposed between the first gate electrode and the semiconductor layer, and a second conductive layer contacting the semiconductor layer. The at least one resistor includes a third conductive layer and is electrically connected to the at least one capacitor.

14 Claims, 12 Drawing Sheets

(56) References Cited

U.S. PATENT DOCUMENTS

| | | | | |
|---|---|---|---|---|
| 2005/0110070 A1* | 5/2005 | Omura | ............... | H01L 27/0629 257/311 |
| 2010/0038692 A1* | 2/2010 | Chuang | ............... | H01L 27/0629 257/298 |
| 2014/0264624 A1* | 9/2014 | Yen | ............... | H01L 28/20 257/379 |
| 2014/0264750 A1* | 9/2014 | Chang | ............... | H01L 27/0629 257/533 |

* cited by examiner

DEVICE INCLUDING RESISTOR-CAPACITOR (RC) STRUCTURE AND METHOD OF MAKING THE SAME

PRIORITY CLAIM AND CROSS-REFERENCE

This application claims the benefit of U.S. Provisional Application No. 62/511,373, filed May 26, 2017, which application is expressly incorporated by reference herein in its entirety.

BACKGROUND

This disclosure relates to semiconductor devices and methods of making the same. More particularly, the disclosed subject matter relates to a method for making a device having a resistor-capacitor structure, and the resulting device.

As complementary metal oxide semiconductor (CMOS) devices are scaled to smaller sizes, new materials and concepts are being considered to meet advanced performance targets. CMOS technology includes N-type metal oxide semiconductor (NMOS) and P-type metal oxide semiconductor (PMOS). For example, a metal-oxide-semiconductor field-effect transistor (MOSFET) is a transistor used for amplifying or switching electronic signals. One performance criterion for NMOS and PMOS MOSFETs, and various other devices, is device switching frequency. Contacts are made to the gate electrodes, and to both the source and drain regions, of the transistors.

A resistor-capacitor (RC) circuit, or RC structure or RC network, is an electric circuit composed of resistors and capacitors driven by a voltage or current source. RC circuits provides different functions. For example, RC circuits can be used to filter a signal by blocking certain frequencies and passing others.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. Like reference numerals denote like features throughout specification and drawings.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure the singular forms "a," "an," and "the" include the plural reference, and reference to a particular numerical value includes at least that particular value, unless the context clearly indicates otherwise. Thus, for example, a reference to "a nano structure" is a reference to one or more of such structures and equivalents thereof known to those skilled in the art, and so forth. When values are expressed as approximations, by use of the antecedent "about," it will be understood that the particular value forms another embodiment. As used herein, "about X" (where X is a numerical value) preferably refers to ±10% of the recited value, inclusive. For example, the phrase "about 8" preferably refers to a value of 7.2 to 8.8, inclusive; as another example, the phrase "about 8%" preferably (but not always) refers to a value of 7.2% to 8.8%, inclusive. Where present, all ranges are inclusive and combinable. For example, when a range of "1 to 5" is recited, the recited range should be construed as including ranges "1 to 4", "1 to 3", "1-2", "1-2 & 4-5", "1-3 & 5", "2-5", and the like. In addition, when a list of alternatives is positively provided, such listing can be interpreted to mean that any of the alternatives may be excluded, e.g., by a negative limitation in the claims. For example, when a range of "1 to 5" is recited, the recited range may be construed as including situations whereby any of 1, 2, 3, 4, or 5 are negatively excluded; thus, a recitation of "1 to 5" may be construed as "1 and 3-5, but not 2", or simply "wherein 2 is not included." It is intended that any component, element, attribute, or step that is positively recited herein may be explicitly excluded in the claims, whether such components, elements, attributes, or steps are listed as alternatives or whether they are recited in isolation.

Different methods have been proposed to provide a semiconductor circuit with an efficient RC structure. For example, a device having a resistor connected with a metal-insulator-metal (MIM) capacitor provides an RC structure. At least one of upper and lower metal electrodes of the MIM capacitor uses a resistive metal plate of a given sheet resistance. The resistive metal plate integrally forms the capacitor electrode and the resistor, establishing a series of RC circuit therebetween. This technique can reduce overall size of a semiconductor device, but has limitations such as incapability of providing a parallel RC circuit. In some embodiments, high resistance patterning techniques are used. But the high resistance patterns are defined by extra masks, and the pattern dimensions are confined in the design tools such as the SPICE (Simulated Program with Integrated Circuit Emphasis) model.

Accordingly, a demand exists for a semiconductor device structure designed to provide efficient RC structures with reduced sizes and allow design flexibility, while achieving size reduction in overall device structures, and excellent and reliable performance of the RC circuit.

Figure 1A:
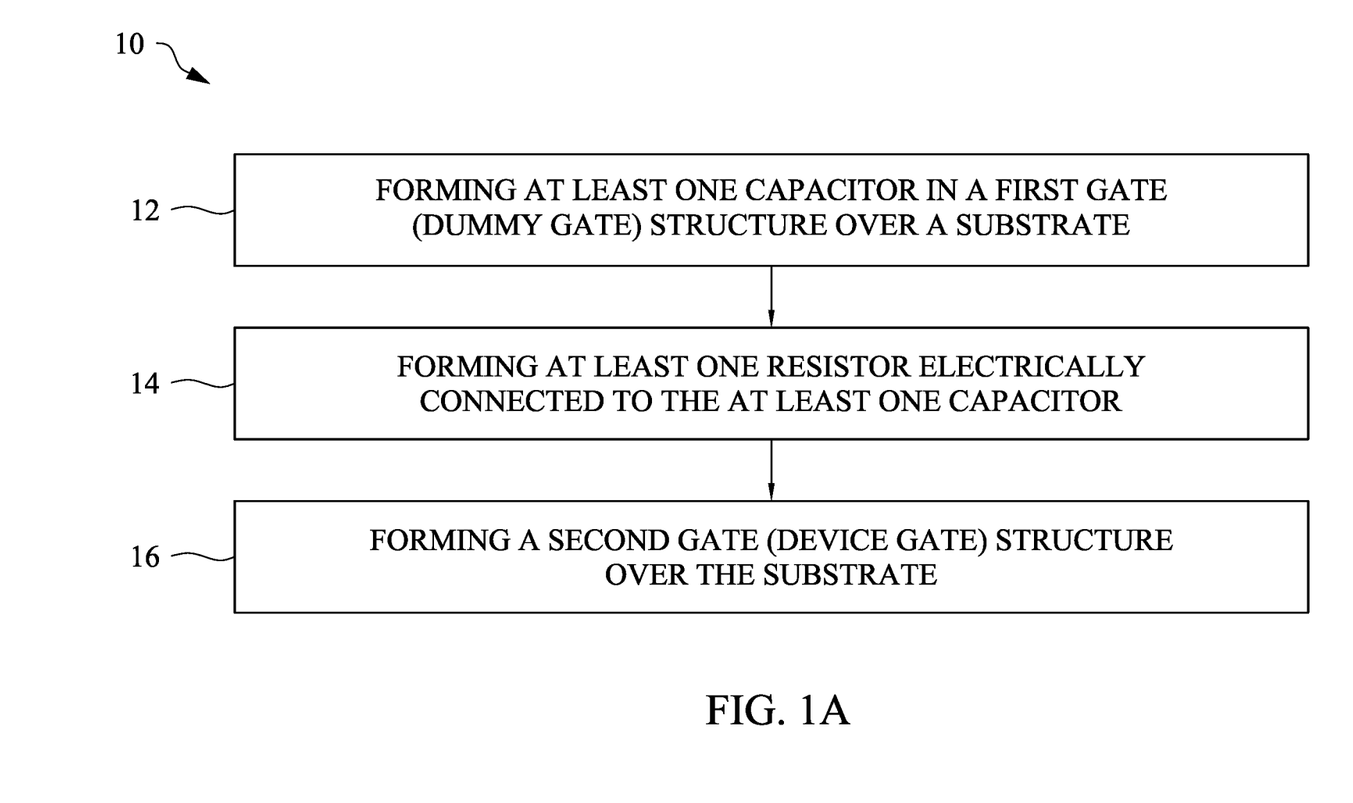
FIG. 1A is a flow chart illustrating a method for forming a semiconductor device in accordance with some embodiments.
Figure 1B:
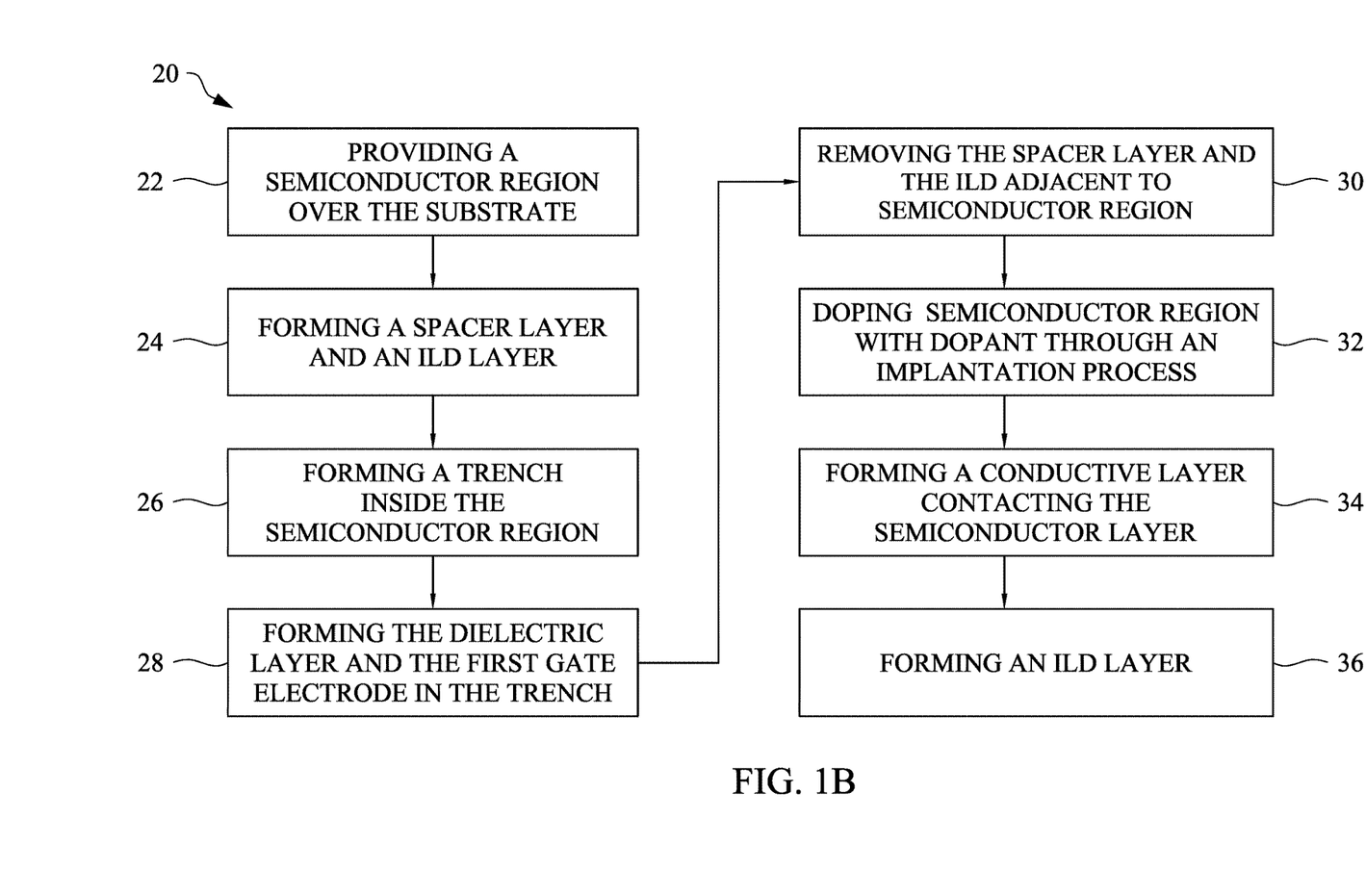
FIG. 1B is a flow chart illustrating a method for forming at least one capacitor in accordance with some embodiments.

The present disclosure provides a method for forming a semiconductor device, and the resulting device. The methods described in FIGS. 1A-1B are described with reference to the structures described in FIGS. 2-11. In FIGS. 2-11, like items are indicated by like reference numerals, and for brevity, descriptions of the structure, provided above with reference to the preceding figures, are not repeated.

For brevity, unless expressly indicated otherwise, references to a "dopant" made below will be understood to encompass a substrate added into a semiconductor material to improve electrical conductivity, and to encompass a p-type dopant, an n-type dopant, and a material within the same group of the semiconductor material. For example, in some embodiments, germanium (Ge) is used as a dopant in polysilicon. The doped semiconductor material is referred as germanium doped silicon, or a IV-IV semiconductor compound. Polysilicon, or poly-si, is polycrystalline silicon, which is a high purity, polycrystalline form of silicon.

Unless expressly indicated otherwise, references to "silicon nitride" and "silicon oxide" made below will be understood to encompass a material comprising silicon and nitrogen at any ratio (e.g., $Si_3N_4$), and a material comprising silicon and oxygen at any ratio (e.g., $SiO_2$), respectively.

Referring to FIG. 1A, a method 10 for making a semiconductor device is illustrated. At step 12, at least one capacitor in a first gate (dummy gate) structure is formed over a substrate 102 (FIGS. 2-10). As described in further detail below, step 12 can include at least steps 28, 32 and 34 as shown in FIG. 1B, in accordance with some embodiments. In addition to steps 28, 32 and 34, step 12 may optionally include other steps such as steps 22, 24, 26 and 30 as shown in FIG. 1B, as discussed in further detail below.

Figure 2:
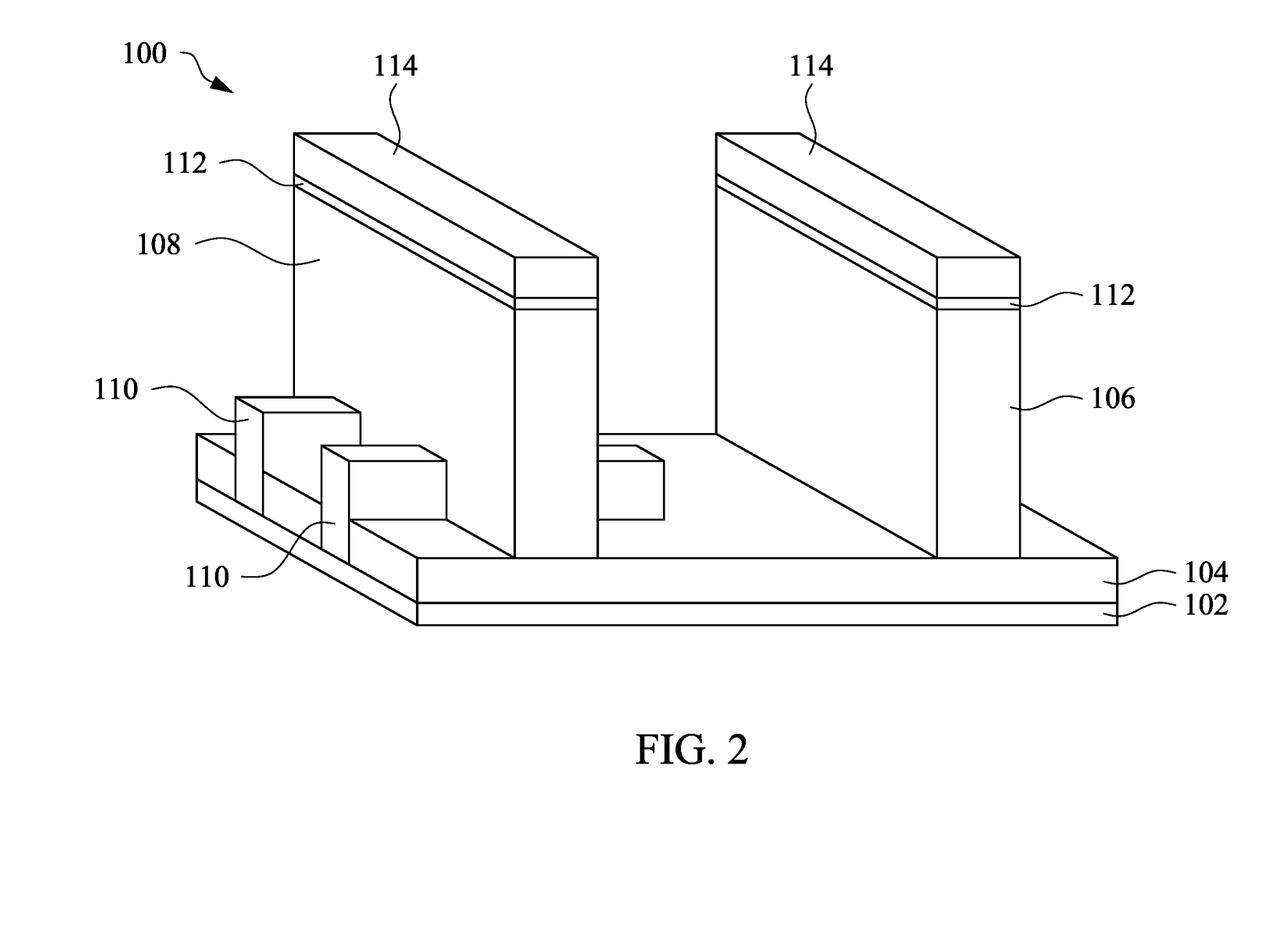
FIGS. 2-5 are perspective views of a portion of a device during fabrication, in which a dummy gate having a semiconductor region and a device gate are formed in accordance with some embodiments.

Referring to FIG. 1B, at step 22, a first semiconductor region 106 comprising the semiconductor material above substrate 102 is provided. Referring to FIG. 2, in some embodiments, a portion of a semiconductor device 100 comprises a first semiconductor region 106 and a second semiconductor region 108 formed above semiconductor substrate 102.

Substrate 102 can be a wafer comprising a semiconductor material. Examples of suitable materials for substrate 102 include, but are not limited to, silicon, germanium, a compound semiconductor, and a semiconductor-on-insulator (SOI) substrate. A compound semiconductor can be an III-V semiconductor compound such as gallium arsenide (GaAs). An SOI substrate can comprise a semiconductor on an insulator such as glass.

An isolator layer or isolation structure such as a shallow trench isolation (STI) regions 104 is formed above substrate 102. STI regions 104 provide electrical isolation of the semiconductor regions separated by the STI regions 104. STI regions 104 are filled with an insulating material which may be, for example, a high density plasma oxide (HDP) material.

Examples of suitable materials for the first and the second semiconductor regions 106, 108 include, but are not limited, to amorphous silicon, polysilicon, polysilicon/germanium, or any other semiconductor material, which may be optionally doped. In some embodiments, the first and the second semiconductor regions 106, 108 comprise or are made of polysilicon, and are formed on or above the STI regions 104. The first semiconductor region 106 is for fabrication of a dummy gate 500, which is further processed for making a RC structure and tuning capacitance and resistance of the RC structure in accordance with some embodiments. The second semiconductor region 108 coupled with fins 110 is for fabrication of a device gate 350. In some embodiments, insulating materials such as a layer of silicon nitride 112 and a layer of silicon oxide 114 may be disposed above the first and the second semiconductor regions 106, 108.

Figure 3:
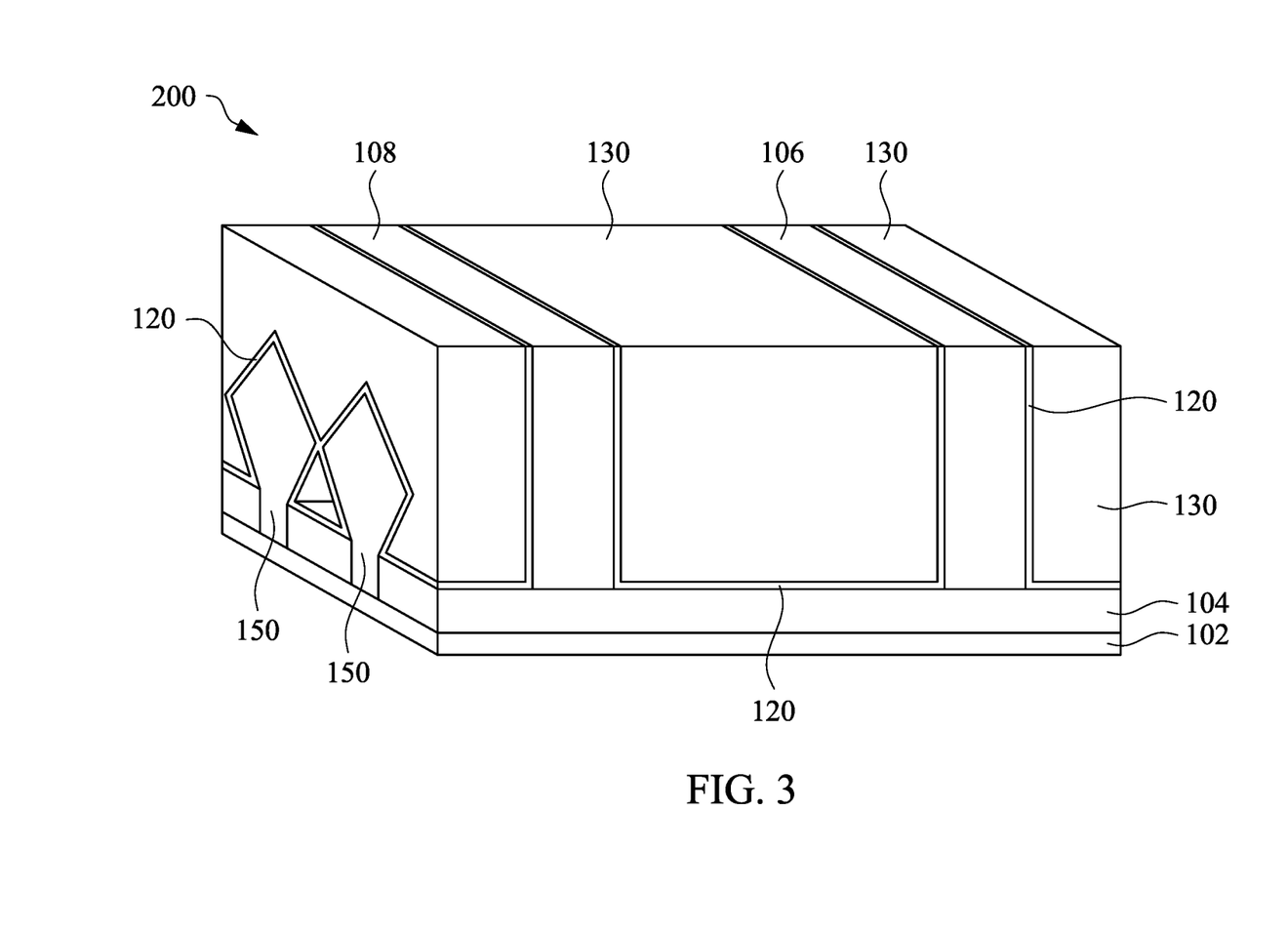

The method can also comprise forming other portions (not shown) of a semiconductor device on or above substrate 102. For example, the other portions can include one or more of a buffer layer, a channel layer, a source region and a drain region. The method can comprise in-situ doping to form a source region and a drain region in the surface of substrate 102. Fins 110 may comprise a semiconductor material such as silicon and are converted into source/drain regions 150 (FIG. 3). The channel layers (not shown) are disposed between the source and drain regions and throughout semiconductor region 108 in some embodiments.

At step 24, a spacer layer 120 and an inter layer dielectric (ILD) layer 130 are formed adjacent to a sidewall of the semiconductor regions 106 and 108. The resulting structure 200 is illustrated in FIG. 3. In some embodiments, a thin spacer layer 120 is coated onto the top surface of the device during fabrication. Spacers 120 has a thickness at Angstroms level in some embodiments, and can be formed of oxides, nitrides, oxynitrides, combination thereof and other suitable insulating materials. In some embodiments, spacers are formed of silicon nitride at any ratio (e.g., $Si_3N_4$) or silicon oxide. ILD layer 130 is filled the space or trenches between semiconductor regions 106 and 108. Examples of suitable materials for the ILD layer 130 include but are not limited to silicon oxide, silicon oxynitride, phosphosilicate glass (PSG), borophosphosilicate glass (BPSG), combinations thereof, or other suitable material. The ILD layer 130 can be formed by using CVD, high density plasma CVD, spin-on, sputtering, or other suitable method.

Figure 4:
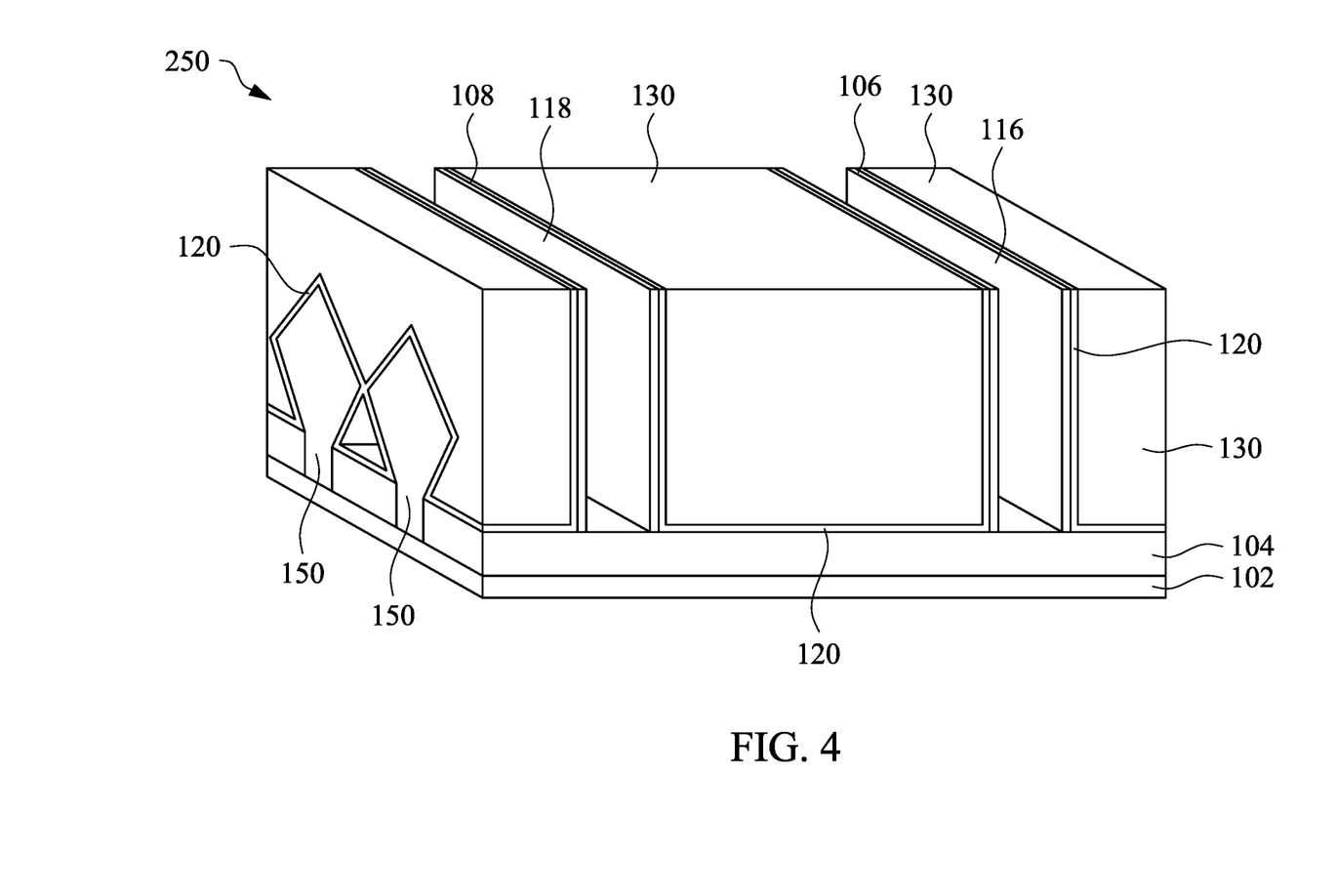

At step 26, a trench 116, 118 is formed inside each of the semiconductor regions 106 and 108, respectively. The resulting structure 250 is illustrated in FIG. 4. Semiconductor regions 106 and 108, which may be made of polysilicon in some embodiments, may be etched using a wet etch, dry etch (e.g., RIE, plasma etch), and/or other suitable processes. In some embodiments, semiconductor regions 106 and 108 may be selectively etched using a processing gas comprising plasma, for example, a fluorine-containing plasma.

Figure 5:
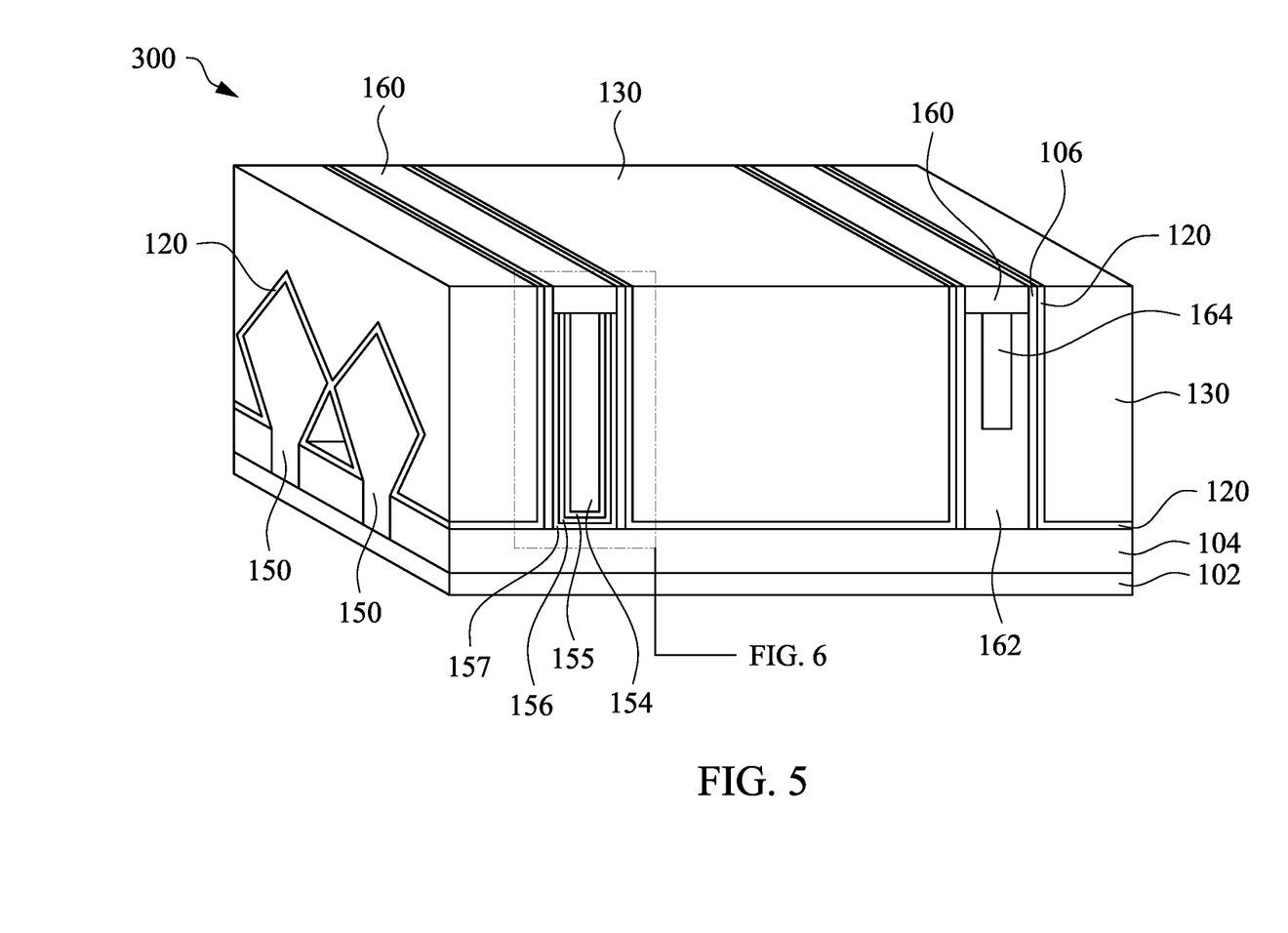

At step 28, dielectric layers 160, 162 and the first gate electrode 164 are formed in the trench 116. Step 28 may comprise several processing steps. Referring to FIG. 5, for example, dielectric layer 162 may be formed inside trench 116, and then etched and filled with the first gate electrode 164. Optionally dielectric layer 160 is formed above gate electrode 164. In some embodiments, dielectric layers 160, 162 comprises silicon nitride.

In some embodiments, the first gate electrode 164 as a metal gate comprising a first conductive layer comprising at least one metal. Examples of suitable material for a metal gate electrode include but are not limited to tungsten, aluminum, copper, titanium, tantalum, molybdenum, platinum, tantalum nitride (TaN), titanium nitride (TiN), tungsten nitride (WN), titanium aluminum (TiAl), titanium aluminum nitride (TiAlN), TaCN, TaC, TaSiN, other conductive material, or combinations thereof.

Figure 6:
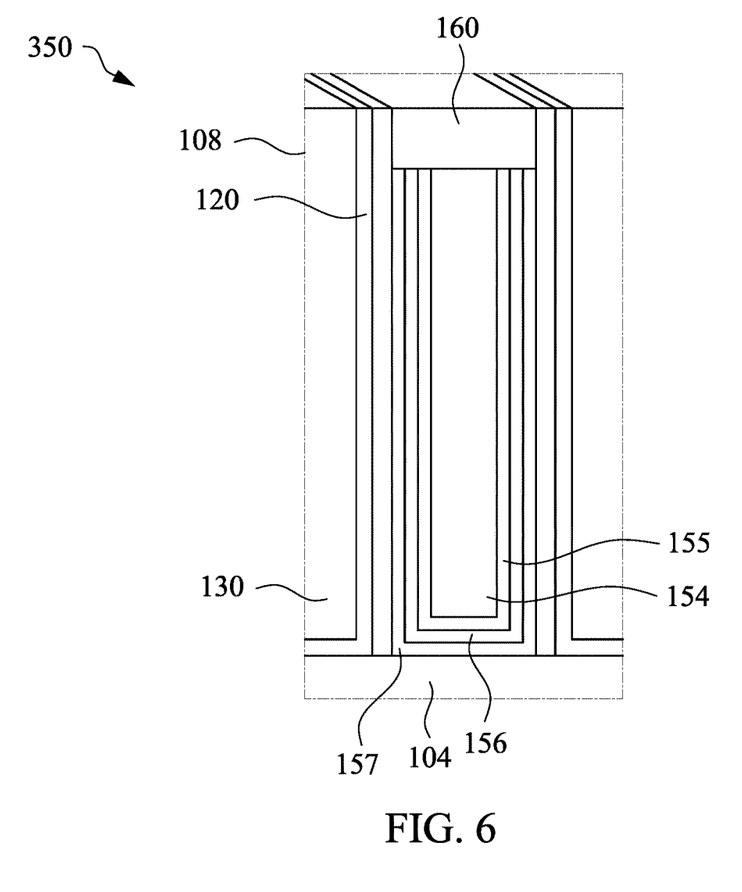
FIG. 6 is a cross-sectional view illustrating an enlarged detail of the device gate in the device of FIG. 5 in some embodiments.

Referring to FIGS. 5-6, in some embodiments, a second gate structure 350 as a device gate is formed at step 16, which is before or after step 28. The second gate structure 350 is coupled with a channel region and/or source and drain regions. The second gate structure 350 is a metal gate in some embodiments, and comprises a second gate electrode 154 filled with at least one metal as described above for the first gate electrode 164. In some embodiments, the second gate electrode 154 is made of tungsten.

The second gate structure 350 may also comprise a high-k dielectric 157 below the second gate electrode 154 and above the substrate 102. Examples of a high-k dielectric material include but are not limited to hafnium oxide ($HfO_2$), hafnium silicon oxide (HfSiO), hafnium silicon oxynitride (HfSiON), hafnium tantalum oxide (HMO), hafnium titanium oxide (HMO), hafnium zirconium oxide (HfZrO), tantalum pentaoxide ($Ta_2O_5$), aluminum oxide ($Al_2O_3$), titanium dioxide ($TiO_2$), and combinations thereof.

The second gate structure 350 may further comprise a work function material layer 155 such as titanium nitride and a layer of dielectric 156 such as silicon nitride between the second gate electrode 164 and the high-k dielectric 157 in some embodiments. The work function material layer 155 is tuned to have a proper work function for enhanced performance of the field effect transistor devices of an integrated circuit. For example, where the field effect transistor devices are NFETs, the work function layer includes an n-type work function metal (n-metal), such as Ta, TiAl, TiAlN, TaCN, other n-type work function metal, or a combination thereof. Where the field effect transistor device is a PFET, the work function layer includes a p-type work function metal (p-metal), such as TiN, TaN, other p-type work function metal, or combination thereof.

Figure 7:
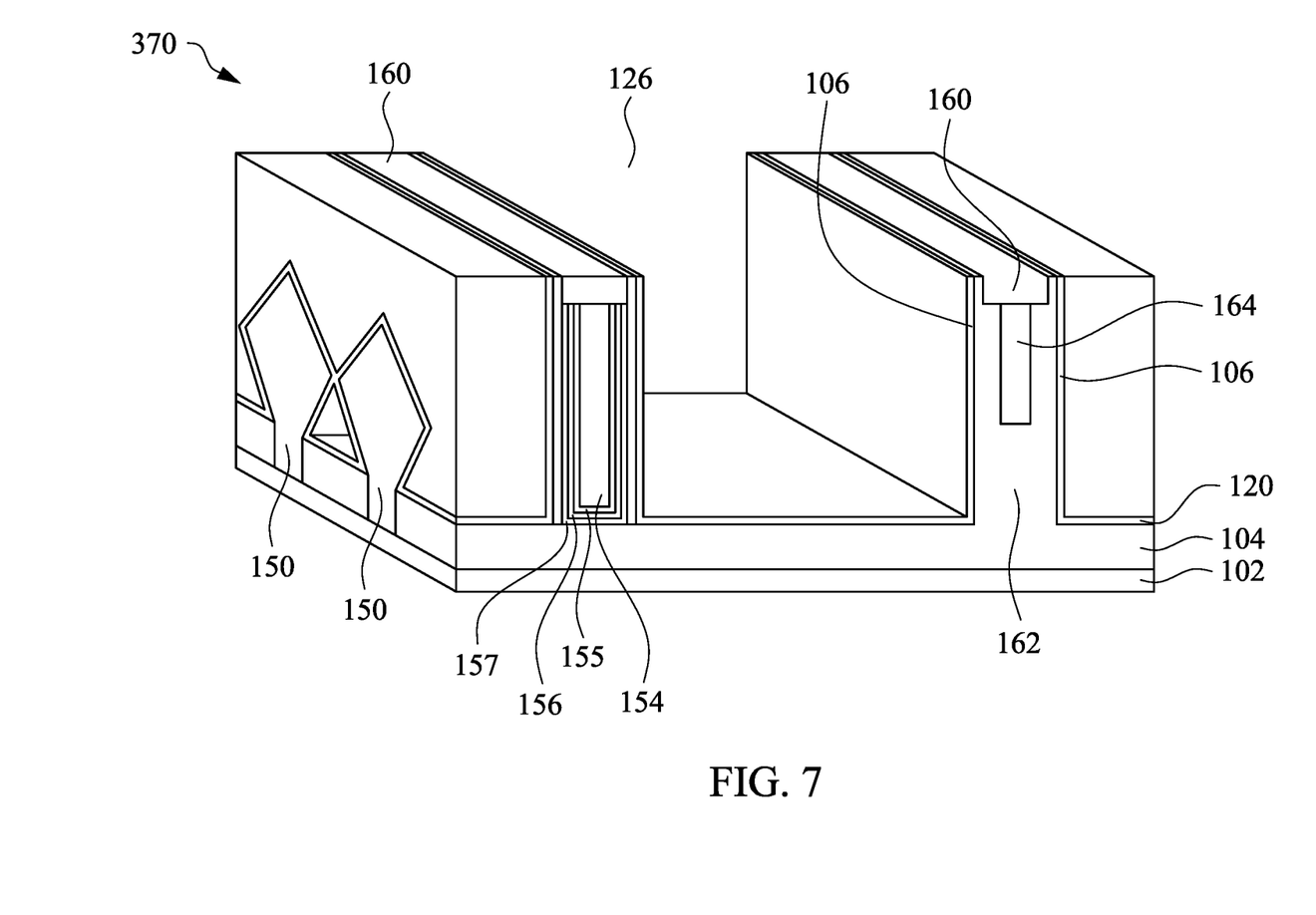
FIG. 7 is a perspective view of the device of FIG. 5 after a spacer layer and an inter layer dielectric (ILD) layer adjacent to a sidewall of the semiconductor region are removed.

Referring back to FIG. 1B, at step 30, the spacer layer 120 and the ILD layer 130 adjacent to the sidewall of the semiconductor region 106 in the first gate structure are removed. Referring to FIG. 7, a trench 126 is formed to expose the semiconductor region 106. The resulting structure 370 is illustrated in FIG. 7.

Figure 8:
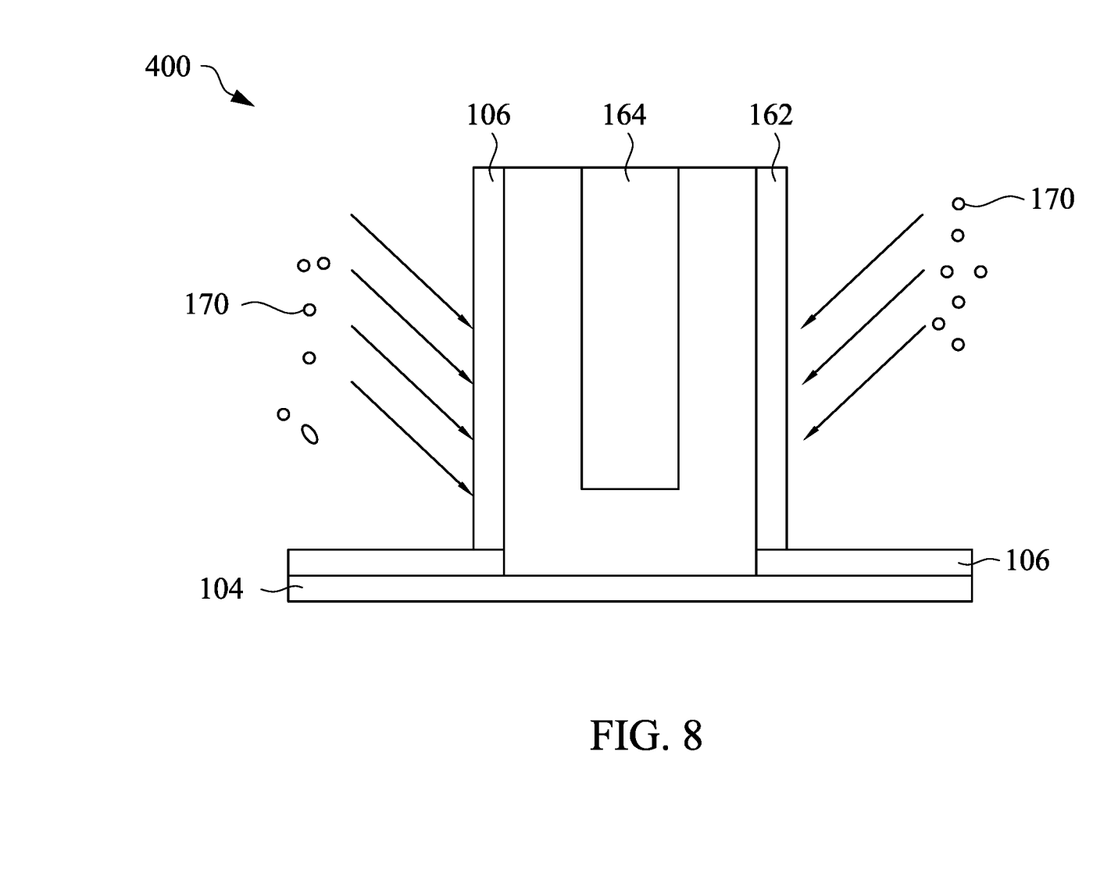
FIG. 8 is a cross-sectional view of a dummy gate illustrating a step of doping the semiconductor region with a dopant through an implantation process so as to form the semiconductor layer for a capacitor in some embodiments.

At step 32, the semiconductor region 106 is doped with the dopant 170 to a pre-determined doping level through an implantation process so as to form the semiconductor layer 176 in the at least one capacitor 178. The dopant 170 may be in the form of ions. The dopant 170 can be any material different from the semiconductor material in the semiconductor region 106, and may be a p-type dopant, an n-type dopant, and a material within the same group of the semiconductor material in the semiconductor region 106. Examples of suitable materials of a dopant include but are not limited to boron, phosphorous, germanium, carbon, and any other materials and combinations thereof. In some embodiments, the semiconductor material is polysilicon. The dopant comprises germanium (Ge). The doped semiconductor material is also referred as Iv-Iv compound semiconductor. The semiconductor layer 176 in the at least one capacitor 178 comprises polysilicon doped with germanium at a concentration in a range of from $1\times10^{13}$ atom/cm$^3$ to $1\times10^{16}$ atom/cm$^3$.

The doping process can be achieved with an ion implantation technique or any other suitable process. A precursor may be a dopant-containing chemical. The precursor gas can be, for example, $GeH_4$ for germanium. In an ion implantation apparatus, electrons collide with the dopant precursor inside the ionization chamber to ionize the dopant molecules to generate plasma. The plasma comprises dopant ions 170, which are extracted through an extraction apparatus to form an ion beam. In some embodiments, an energy source for ion implantation may have a voltage in a range of from 0.5 KeV to 60 KeV.

Figure 9:
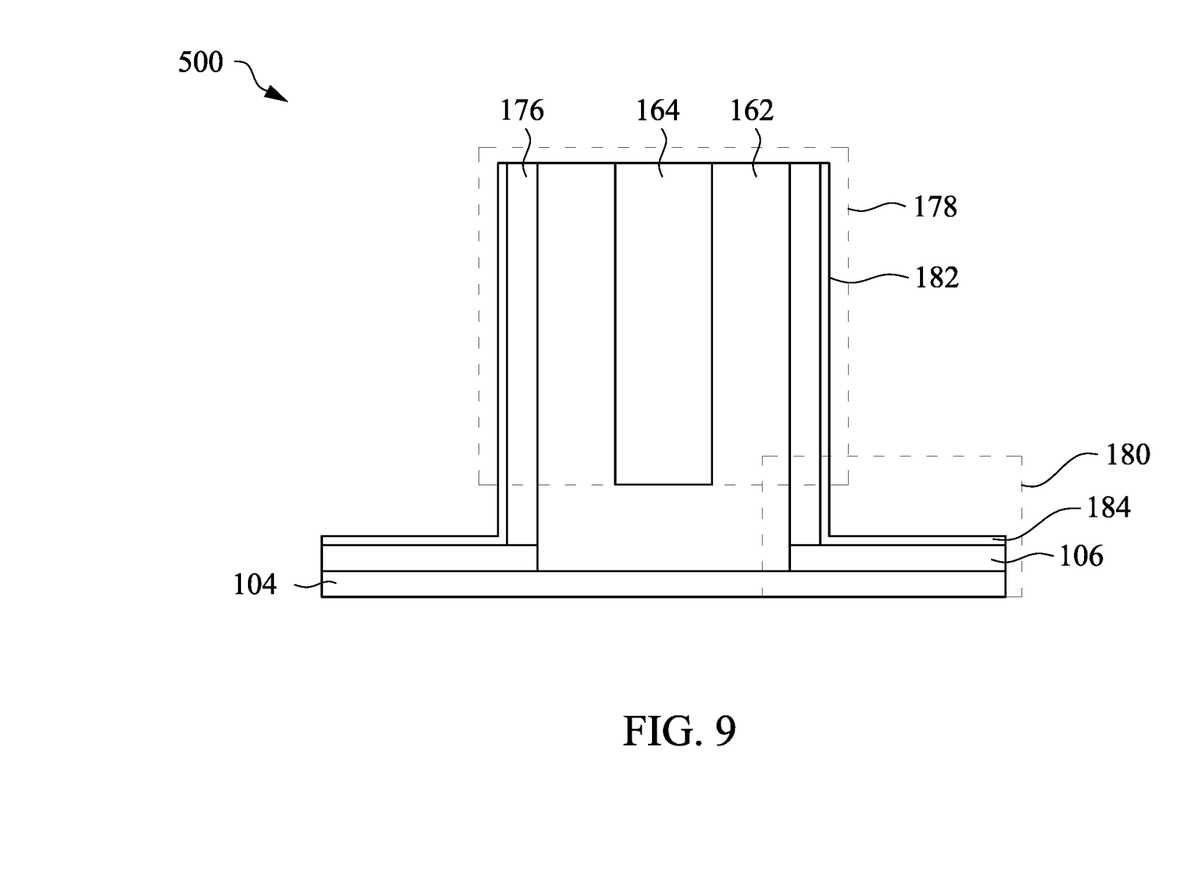
FIG. 9 is a cross-sectional view of the dummy gate of FIG. 8 illustrating a capacitor and a resistor with conductive layers in accordance with some embodiments.

At step 34, the second conductive layer 182 in contact with the semiconductor layer 176 is formed. Examples of suitable materials for the second conductive layer 182 include but are not limited to titanium silicide, tungsten, aluminum, copper, titanium, tantalum, molybdenum, platinum, tantalum nitride (TaN), titanium nitride (TiN), tungsten nitride (WN), titanium aluminum (TiAl), titanium aluminum nitride (TiAlN), TaCN, TaC, TaSiN, other conductive material, or combinations thereof. In some embodiments, the second conductive layer 182 in the at least one capacitor 178 comprises titanium silicide, which may have a thickness in a range of from 10 nm to 60 nm (e.g., 20-30 nm). A layer of titanium may be coated onto the semiconductor layer 176. After an annealing step, titanium reacts with silicon on the surface of and/or inside the semiconductor layer 176 to form a second conductive layer 182 comprising titanium silicide.

Referring to FIG. 1A, at step 14, at least one resistor 180 is formed over the substrate 102. Referring to FIGS. 8 and 9, in some embodiments, a structure 400 may include at least two portions of semiconductor regions 106 in both vertical and horizontal directions. The vertical portion is reacted with the dopant 170 to provide the semiconductor layer 176. The horizontal portion comprising polysilicon may be masked and does not react with the dopant 170. When a layer of titanium is coated onto the semiconductor layer 176 and the horizontal portion of semiconductor region 106, after the annealing step, titanium reacts with silicon on the surface of and/or inside the horizontal portion of semiconductor region 106 to provide the third conductive layer 184. So the third conductive layer 184 in the at least one resistor 180 comprises titanium silicide, which may have a thickness in a range of from 10 nm to 60 nm (e.g., 20-30 nm). Examples of other suitable materials for the third conductive layer 184 include but are not limited to titanium silicide, tungsten, aluminum, copper, titanium, tantalum, molybdenum, platinum, tantalum nitride (TaN), titanium nitride (TiN), tungsten nitride (WN), titanium aluminum (TiAl), titanium aluminum nitride (TiAlN), TaCN, TaC, TaSiN, other conductive material, or combinations thereof.

Figure 10:
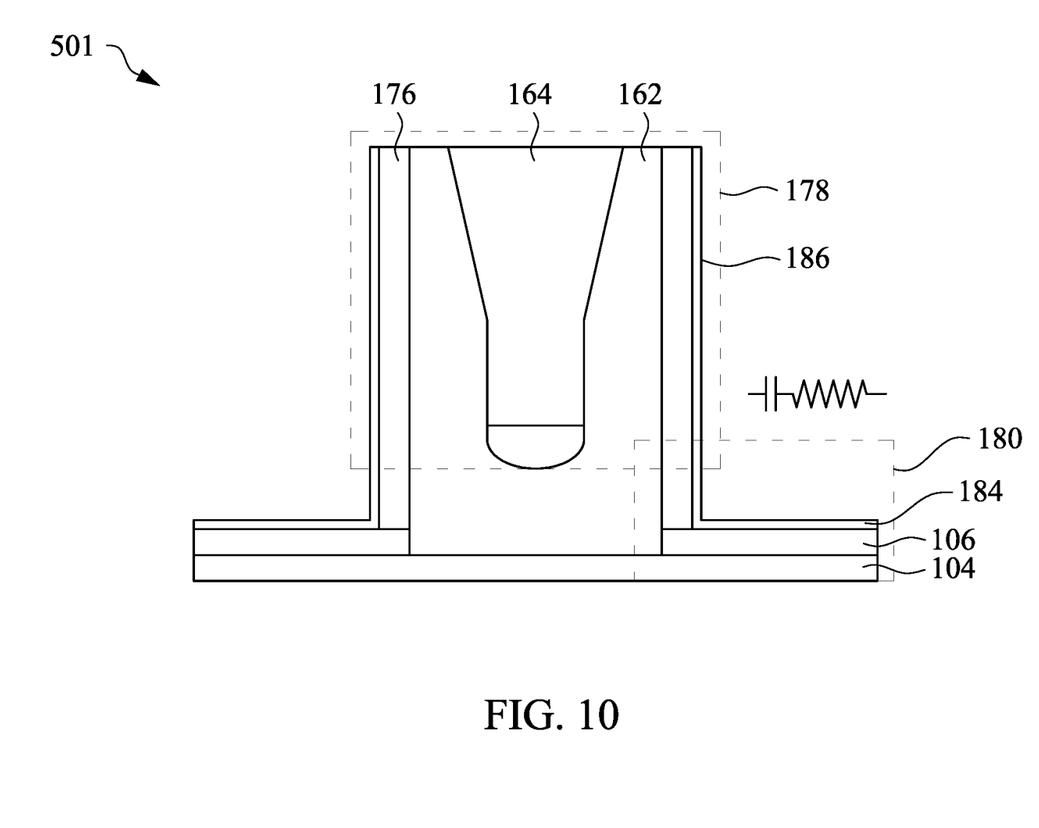
FIG. 10 is a cross-sectional view of another dummy gate having a capacitor and a resistor in some embodiments.

Referring to FIGS. 9 and 10, two RC structures 500 and 501 are illustrated. Dummy gates having RC structures 500 and 501 are identical except the difference in the shape of the first gate electrode 164. The first gate electrode 164 can be in any suitable shape, for example, cuboid, rectangular prism, cylinder, cone, or any combination thereof. The RC structure 500 or 501 comprises the at least one capacitor 178 and the at least one resistor 180, which may be connected in series or in parallel, or any combination thereof.

The capacitor 178 is formed by the first gate electrode 164 and a second conductive layer 182 in combination with the semiconductor layer 176. The capacitor 178 may be in any suitable shape including but are not limited cuboid, rectangular prism, and cylinder. The at least one resistor 180 is formed by the third conductive layer 184, optionally in combination with the horizontal portion of semiconductor region 106. The concentration of the dopant such as germanium, which is tunable through an ion implantation process for doping, is used to tailor the electric properties of a RC structure comprising the at least one capacitor 178 and the at least one resistor 180. This approach provides flexibility to fabricate a RC structure having any desirable capacitance and resistance. The resulting RC structure is used to adjust electrical properties of an integrated circuit having the dummy gate 500 and the device gate 350.

Referring to FIG. 1B, at step 36, an ILD layer 130 can be applied to the device. Subsequent processing steps may be performed, for example, to form multi-tier structures and interconnects between tiers. A resulting device 550 comprising the structural features as described above is illustrated in FIG. 11.

Figure 11:
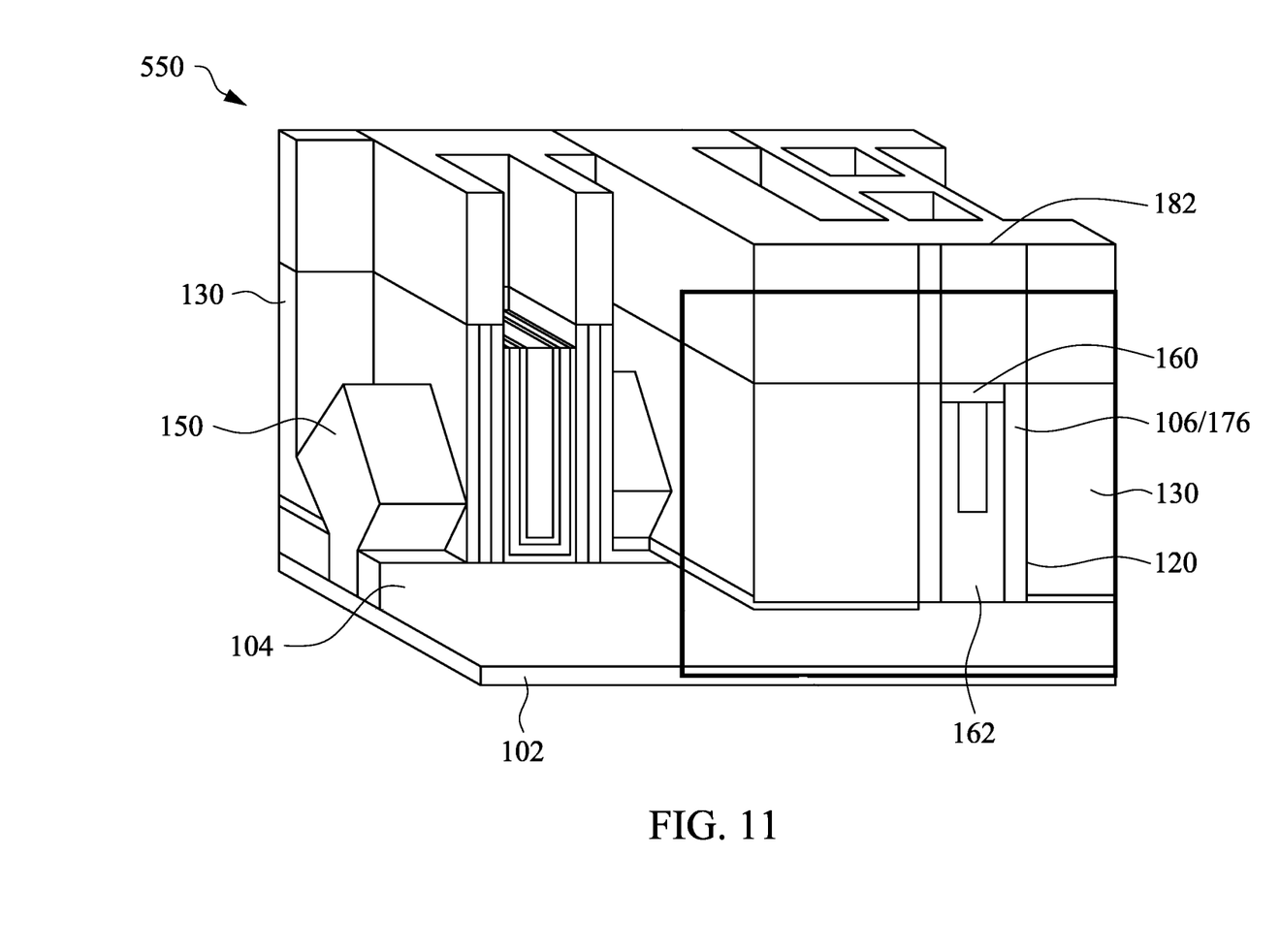
FIG. 11 is a perspective view illustrating a resulting device having a multi-layer structure in accordance with some embodiments.

Device 550 comprises a RC structure comprising at least one capacitor 178 in a first gate (dummy gate) structure 500 or 501 over a substrate, and at least one resistor 180 is formed over the substrate 102. The first gate structure 500 or 501 is a metal gate in some embodiments. The at least one capacitor 178 comprises a first gate electrode 164 comprising a first conductive layer, a semiconductor layer 176 comprising a semiconductor material and a dopant, a dielectric layer 162 disposed between the first gate electrode 164 and the semiconductor layer 176, and a second conductive layer 182 contacting the semiconductor layer 176. The at least one resistor 180 comprises a third conductive layer 184, and is electrically connected to the at least one capacitor 178.

In some embodiments, the first semiconductor material comprises polysilicon, and the dopant 170 comprises germanium with a concentration in a range of from $1\times10^{13}$ atom/cm$^3$ to $1\times10^{16}$ atom/cm$^3$. The dielectric layer 162 comprises polysilicon nitride and the first conductive layer in the first gate electrode 164 comprises tungsten. In some embodiments, the at least one capacitor 178 is in a shape of cuboid or rectangular prism, or any other suitable shape. The semiconductor layer 176 is in a shape of a hollow cuboid or rectangular prism having a top and a bottom face open. The first gate electrode 164 is disposed therein.

The device 550 may further comprise source/drain regions 150, a channel region (not shown) and a second gate structure (e.g., device/metal gate) 350 coupled with a channel region. The channel region is not shown, and disposed between the source/drain regions and underneath the second gate (device gate) 350. The second gate structure 350 comprises a second gate electrode 154 filled with a conductive material such as at least one metal, and a high-k dielectric 157 below the second gate electrode 154 and above the substrate 102.

In one aspect, the present disclosure provides a method for forming a semiconductor device. Such a method comprises the steps of forming at least one capacitor in a first gate (dummy gate) structure over a substrate, and forming at least one resistor over the substrate. The at least one capacitor comprises a first gate electrode comprising a first conductive layer, a semiconductor layer comprising a semiconductor material and a dopant, a dielectric layer disposed between the first gate electrode and the semiconductor layer, and a second conductive layer contacting the semiconductor layer. The at least one resistor comprises a third conductive layer, and is electrically connected to the at least one capacitor.

In some embodiments, the step of forming the at least one capacitor comprises the following steps: providing a semiconductor region comprising the semiconductor material over the substrate, forming a trench inside the semiconductor region, forming the dielectric layer and the first gate electrode in the trench, doping the semiconductor region with the dopant to a pre-determined doping level through an implantation process so as to form the semiconductor layer in the at least one capacitor, and forming the second conductive layer contacting the semiconductor layer. Such a method may further comprise a step of: forming a spacer layer and an inter layer dielectric (ILD) layer adjacent to a sidewall of the semiconductor region before forming a trench inside the semiconductor region. Such a method may also comprise a step of removing the spacer layer and the ILD layer adjacent to the sidewall of the semiconductor region before doping the semiconductor region with the dopant.

In some embodiments, the semiconductor material is polysilicon. The dopant comprises germanium (Ge). The semiconductor layer in the at least one capacitor comprises polysilicon doped with germanium at a concentration in a range of from $1\times10^{13}$ atom/cm$^3$ to $1\times10^{16}$ atom/cm$^3$.

In some embodiments, the first gate structure is a metal gate. The first conductive layer in the first gate electrode comprises at least one metal. The second conductive layer in the at least one capacitor and the third conductive layer in the at least one resistor may be the same or different, and may comprise titanium silicide in some embodiments.

In some embodiments, the method provided in the present disclosure further comprises steps of forming a second gate structure as a device gate coupled with a channel region and/or source and drain regions. The second gate structure is a metal gate in some embodiments, and comprises a second gate electrode filled with at least one metal. The second gate structure may also comprise a high-k dielectric below the second gate electrode and above the substrate.

More specifically, the present disclosure provides a method for forming a semiconductor device. Such a method comprises the steps of forming at least one capacitor in a first gate (dummy gate) structure over a substrate, and forming at least one resistor over the substrate. The at least one capacitor comprises a first gate electrode comprising a first conductive layer of at least one metal, a semiconductor layer comprising polysilicon and germanium as a dopant, a dielectric layer disposed between the first gate electrode and the semiconductor layer, and a second conductive layer contacting the semiconductor layer. The at least one resistor comprises a third conductive layer, and is electrically connected to the at least one capacitor. The at least one capacitor and the at least one resistor form a resistor-capacitor (RC) structure.

In some embodiments, the step of forming the at least one capacitor comprises the following steps: providing a semiconductor region comprising silicon over the substrate, forming a trench inside the semiconductor region, forming the dielectric layer and the first gate electrode in the trench, doping the semiconductor region with germanium to a pre-determined doping level through an implantation process so as to form the semiconductor layer in the at least one capacitor, and forming the second conductive layer contacting the semiconductor layer. In some embodiments, the pre-determined doping level is a concentration of germanium in polysilicon in a range of from $1\times10^{13}$ atom/cm$^3$ to $1\times10^{16}$ atom/cm$^3$. The dielectric layer comprises silicon nitride and the at least one metal in the first gate electrode comprises tungsten. The second conductive layer in the at least one capacitor and the third conductive layer in the at least one resistor comprises titanium silicide.

In another aspect, the present disclosure provides a semiconductor device. Such a device comprises at least one capacitor in a first gate structure (e.g., dummy/metal gate) disposed over a substrate. The at least one capacitor comprises a first gate electrode comprising a first conductive layer, a semiconductor layer comprising a semiconductor material and a dopant, a dielectric layer disposed between the first gate electrode and the semiconductor layer, and a second conductive layer contacting the semiconductor layer. The device further comprises at least one resistor over the substrate. The at least one resistor comprises a third conductive layer, and is electrically connected to the at least one capacitor.

In some embodiments, the semiconductor material comprises polysilicon, and the dopant comprises germanium with a concentration in a range of from $1\times10^{13}$ atom/cm$^3$ to $1\times10^{16}$ atom/cm$^3$. The dielectric layer comprises polysilicon nitride and the first conductive layer in the first gate electrode comprises tungsten. In some embodiments, the at least one capacitor is in a shape of cuboid or rectangular prism. The semiconductor layer is in a shape of a hollow cuboid or rectangular prism. The first gate electrode is disposed therein.

The device may further comprise source/drain regions, a channel region, and a second gate structure (e.g., device/metal gate) coupled with a channel region. The second gate structure comprises a second gate electrode filled with at least one metal, and a high-k dielectric below the second gate electrode and above the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device, comprising:
    forming at least one capacitor in a first gate structure over a substrate, the at least one capacitor comprising
        a first gate electrode comprising a first conductive layer,
        a semiconductor layer comprising a semiconductor material and a dopant,
        a dielectric layer disposed between the first gate electrode and the semiconductor layer, and
        a second conductive layer contacting the semiconductor layer; and
    forming at least one resistor over the substrate, the at least one resistor comprising a third conductive layer and electrically connected to the at least one capacitor.

2. The method of claim 1, wherein the forming the at least one capacitor comprises:
    providing a semiconductor region comprising the semiconductor material over the substrate;
    forming a trench inside the semiconductor region;
    forming the dielectric layer and the first gate electrode in the trench;
    doping the semiconductor region with the dopant to a pre-determined doping level through an implantation process so as to form the semiconductor layer in the at least one capacitor; and
    forming the second conductive layer.

3. The method of claim 2, further comprises:
    forming a spacer layer and an inter layer dielectric (ILD) layer adjacent to a sidewall of the semiconductor region before the forming of the trench inside the semiconductor region; and
    removing the spacer layer and the ILD layer adjacent to the sidewall of the semiconductor region before the doping of the semiconductor region with the dopant.

4. The method of claim 1, wherein the semiconductor material is polysilicon.

5. The method of claim 1, wherein the dopant comprises germanium (Ge).

6. The method of claim 1, wherein the semiconductor layer in the at least one capacitor comprises polysilicon doped with germanium at a concentration in a range of from $1\times10^{13}$ atom/cm$^3$ to $1\times10^{16}$ atom/cm$^3$.

7. The method of claim 1, wherein the first conductive layer in the first gate electrode comprises at least one metal.

8. The method of claim 1, wherein the second conductive layer in the at least one capacitor and the third conductive layer in the at least one resistor comprises titanium silicide.

9. The method of claim 1, further comprising forming a second gate structure as a device gate, wherein the second gate structure comprises a second gate electrode filled with at least one metal, and a high-k dielectric below the second gate electrode and above the substrate, wherein the first gate structure is a dummy gate.

10. A method for forming a semiconductor device, comprising:
    forming at least one capacitor in a first gate structure over a substrate, the at least one capacitor comprising
        a first gate electrode comprising a first conductive layer of at least one metal,
        a semiconductor layer comprising polysilicon and germanium as a dopant,
        a dielectric layer disposed between the first gate electrode and the semiconductor layer, and
        a second conductive layer contacting the semiconductor layer; and
    forming at least one resistor over the substrate, the at least one resistor comprising a third conductive layer and electrically connected to the at least one capacitor.

11. The method of claim 10, wherein the forming the at least one capacitor comprises:
    providing a semiconductor region comprising silicon over the substrate;
    forming a trench inside the semiconductor region;
    forming the dielectric layer and the first gate electrode in the trench;
    doping the semiconductor region with germanium to a pre-determined doping level through an implantation process so as to form the semiconductor layer in the at least one capacitor; and
    forming the second conductive layer.

12. The method of claim 11, wherein the pre-determined doping level is a concentration of germanium in polysilicon in a range of from $1\times10^{13}$ atom/cm$^3$ to $1\times10^{16}$ atom cm$^3$.

13. The method of claim 11, wherein the dielectric layer comprises silicon nitride and the at least one metal in the first gate electrode comprises tungsten.

14. The method of claim 10, wherein the second conductive layer in the at least one capacitor and the third conductive layer in the at least one resistor comprises titanium silicide.

* * * * *